(12) United States Patent
Chin et al.

(10) Patent No.: US 8,153,463 B2
(45) Date of Patent: Apr. 10, 2012

(54) METHOD OF MANUFACTURING THIN FILM TRANSISTOR SUBSTRATE

(75) Inventors: Hong-Kee Chin, Suwon-si (KR); Yunjong Yeo, Seoul (KR); Sanggab Kim, Seoul (KR); Junho Song, Seongnam-si (KR); Kyehun Lee, Asan-si (KR); Ho-Jun Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 12/729,172

(22) Filed: Mar. 22, 2010

(65) Prior Publication Data

US 2011/0086474 A1    Apr. 14, 2011

(30) Foreign Application Priority Data

Oct. 12, 2009  (KR) .................. 10-2009-0096807

(51) Int. Cl.
*H01L 21/00* (2006.01)

(52) U.S. Cl. ............ 438/30; 438/149; 438/608; 438/70; 257/E21.006; 257/E21.058; 257/E21.227; 257/E21.229

(58) Field of Classification Search .................. 438/30, 438/70, 311, 149, 448, 608, 637, 706, 745; 257/E21.006, E21.058, E21.227, E21.229
See application file for complete search history.

(56) References Cited

U.S. PATENT DOCUMENTS

| 7,018,930 | B2 * | 3/2006 | Lee et al. ...................... 438/706 |
| 7,241,648 | B2 * | 7/2007 | Huang ............................ 438/149 |
| 7,799,699 | B2 * | 9/2010 | Nuzzo et al. .................. 438/758 |

FOREIGN PATENT DOCUMENTS

| KR | 10-2008-0018496 | 2/2008 |
| KR | 10-2008-0039030 | 5/2008 |

* cited by examiner

*Primary Examiner* — David Nhu
(74) *Attorney, Agent, or Firm* — Innovation Counsel LLP

(57) ABSTRACT

A method of manufacturing a thin film transistor substrate includes a first process in which a gate line pattern including a gate line and a gate electrode is formed with a first conductive material on a substrate using a first mask, a second process in which a first insulating layer is formed on the substrate and a data line pattern including a data line, a source electrode, and a drain electrode is formed with a second conductive material using a second mask, and a third process in which a second insulating layer is formed on the substrate and a pixel electrode connected to the drain electrode is formed on the second insulating layer with a third conductive material.

21 Claims, 22 Drawing Sheets

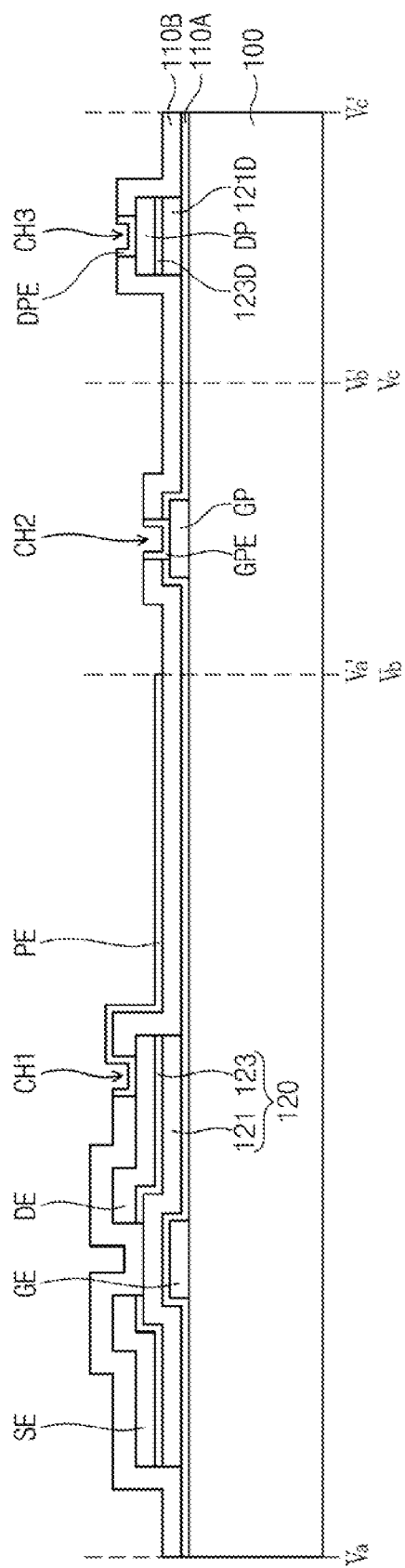

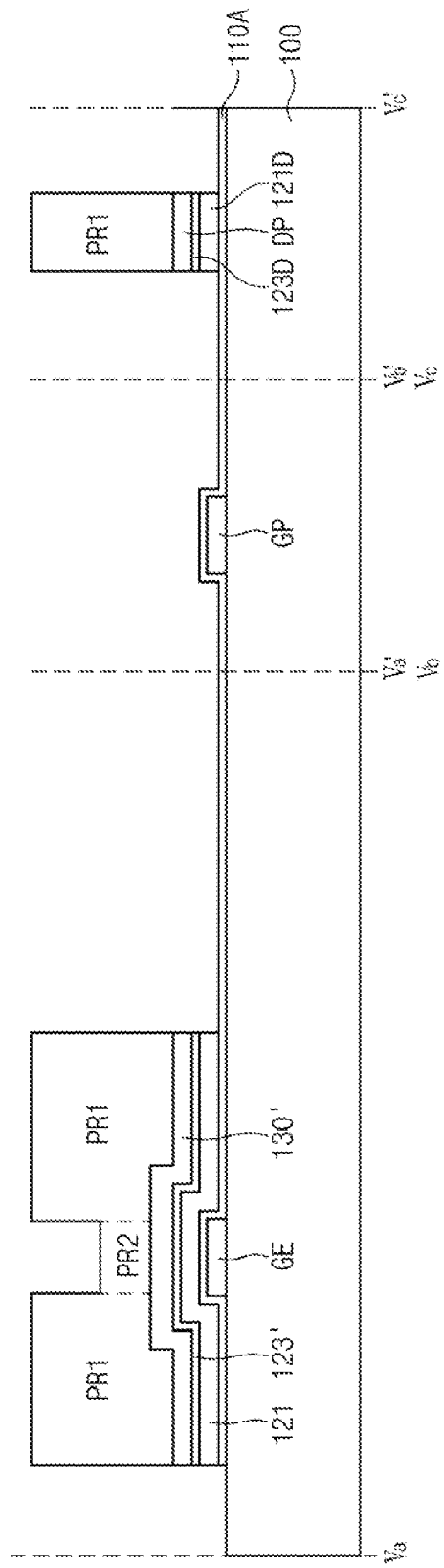

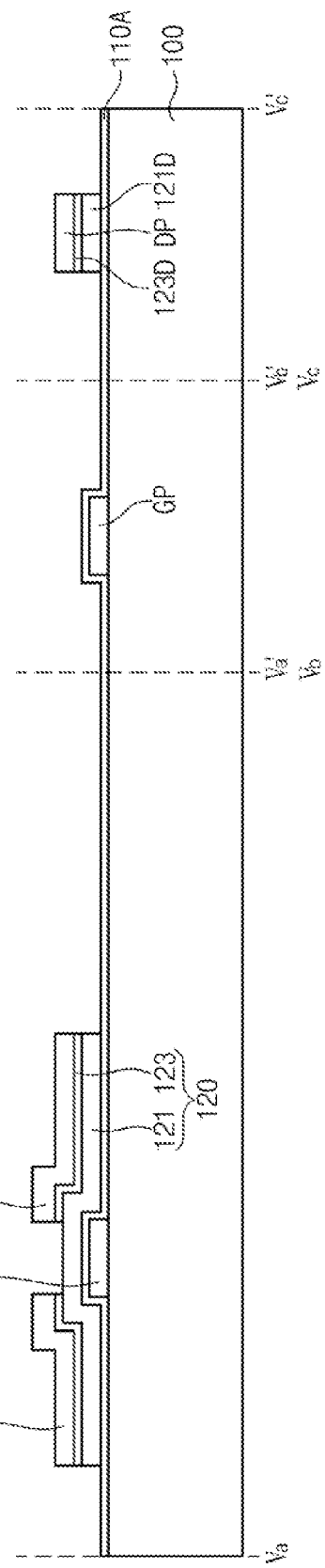

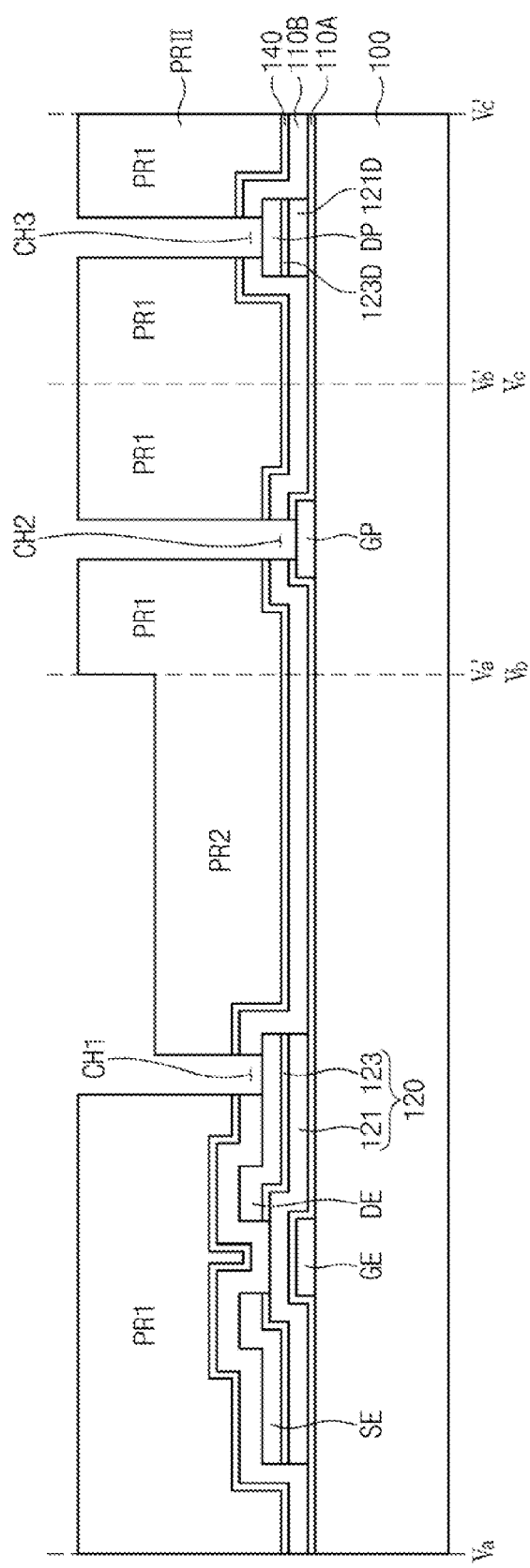

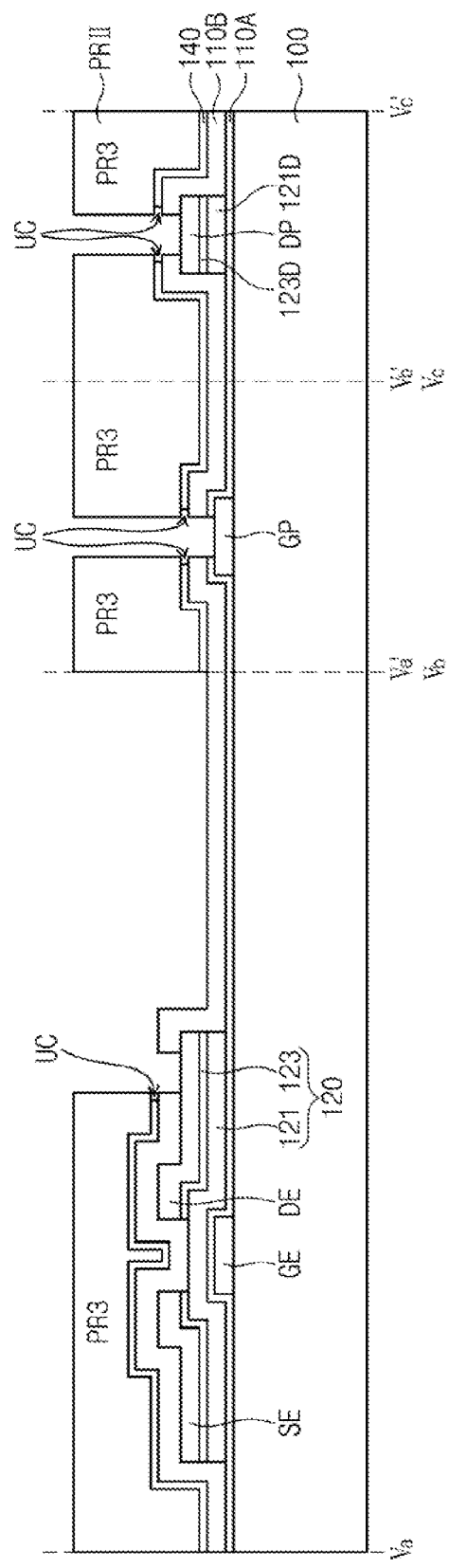

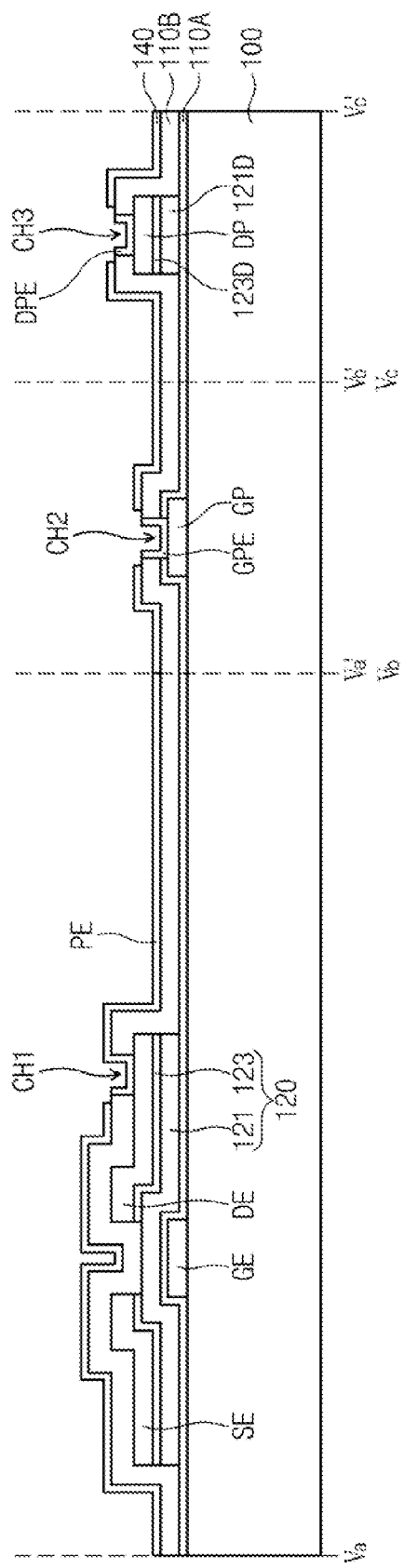

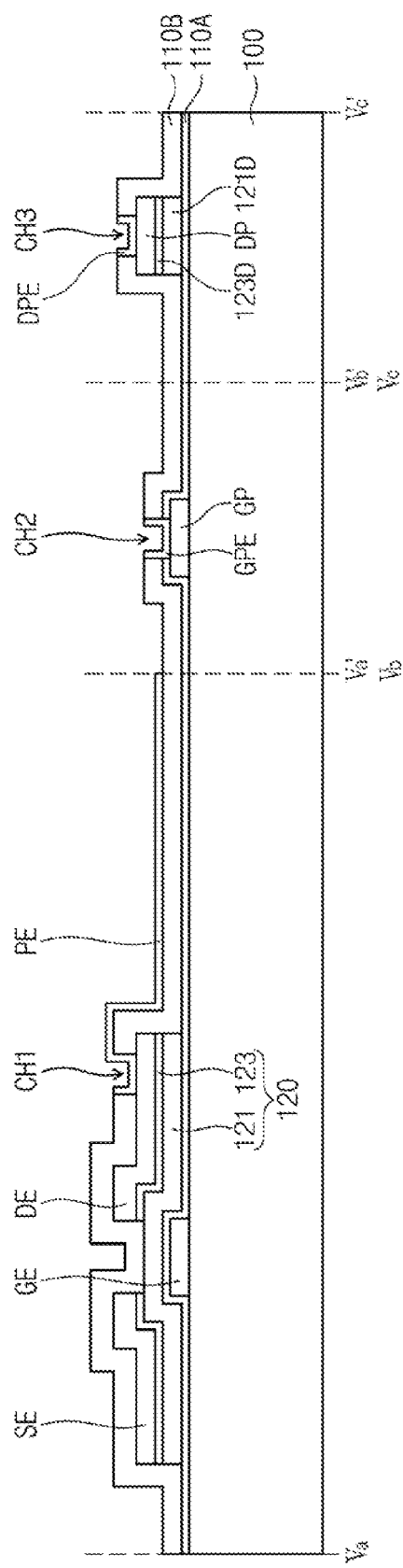

METHOD OF MANUFACTURING THIN FILM TRANSISTOR SUBSTRATE

CROSS-REFERENCE TO RELATED APPLICATION

This application claims priority to Korean Patent Application No. 2009-96807 filed on Oct. 12, 2009, the contents of which are herein incorporated by reference in its entirety.

BACKGROUND

1. Field of the Invention

The present invention relates to a method of manufacturing a thin film transistor substrate. More particularly, the present invention relates to a method of manufacturing a thin film transistor substrate using three masks.

2. Description of the Related Art

In general, a display apparatus displaying an image includes a substrate. The substrate includes a plurality of pixel areas defined thereon to display the image. Each pixel area includes a thin film transistor and a pixel electrode. In order to form the thin film transistor and the pixel electrode, a conductive layer is formed on the substrate and patterned.

The substrate includes various insulating layers formed on and under the thin film transistor or the pixel electrode. Patterning processes for conductive layers and the insulating layers are required to manufacture the substrate for the display apparatus. In the patterning processes, a photolithography process including an exposure and development is performed.

In general, the photolithography process is performed independently at each layer, and at least four photolithography processes are repeatedly performed to form the thin film transistor and the pixel electrode for a liquid crystal display. As the number of photolithography processes increases, the whole manufacturing process becomes complicated, thereby causing the increase in manufacturing cost.

SUMMARY

Embodiments of the present invention provide a method of manufacturing a thin film transistor substrate using three masks According to the embodiments, a method of manufacturing a thin film transistor substrate includes a first process of forming a gate line pattern including a gate line and a gate electrode with a first conductive material on a substrate using a first mask, a second process of forming a first insulating layer on the substrate and forming a data line pattern including a data line, a source electrode, and a drain electrode with a second conductive material on the insulating layer using a second mask, and a third process of forming a second insulating layer on the substrate and forming a pixel electrode connected to the drain electrode with a third conductive material on the second insulating layer.

The data line pattern includes at least one selected from a group consisting of copper, molybdenum, and aluminum and the data line pattern has a single layer structure, a multi-layer structure, or an alloy layer.

The third process is provided as follows. The second insulating layer is formed on the substrate, a sacrificial layer is formed on the second insulating layer, and a photoresist layer is formed on the sacrificial layer. Then, the photoresist layer is exposed to a light and developed to form a photoresist layer pattern and the sacrificial layer and the second insulating layer are partially removed using the photoresist layer pattern as a mask to partially expose the drain electrode. The substrate is etched to form an undercut on the sacrificial layer under the photoresist layer pattern, a pixel electrode layer is formed with the third conductive material over an entire surface of the substrate, and the photoresist layer pattern and the pixel electrode layer on the photoresist layer pattern are removed to form the pixel electrode. The sacrificial layer includes a single layer of titanium, a single layer of molybdenum, a multi-layer of titanium and molybdenum, or an alloy of titanium and molybdenum, and the sacrificial layer is formed with a thickness from about 500 Å to about 3,000 Å.

The photoresist layer pattern including a first photoresist layer pattern and a second photoresist layer pattern is formed by exposing the photoresist layer to the light through a diffraction mask and developing the photoresist layer. The first photoresist layer pattern has a first thickness in a first area and the second photoresist layer pattern has a second thickness thinner than the first thickness in a second area different from the first area.

The sacrificial layer and the second insulating layer are partially removed by using the first and second photoresist layer patterns as the mask, to thereby form a first contact hole through which the drain electrode is partially exposed.

The pixel electrode is connected to the drain electrode through the first contact hole.

The sacrificial layer is partially removed by a dry etch process using a chloride-based compound and the second insulating layer is partially removed by a dry etch process using a fluoride-based compound. The chloride-based compound is an etchant including at least one of $Cl_2$ and $BCl_3$, and the fluoride-based compound is an etchant including at least one of $SF_6$ and $CF_4$.

The undercut is formed on the sacrificial layer by removing the second photoresist layer pattern and a portion of the first photoresist layer pattern to form a third photoresist layer pattern having a third thickness and by wet-cleaning the substrate using a fluoride-based cleaning solution to partially remove the sacrificial layer formed under the first photoresist layer pattern. The fluoride-based cleaning solution includes HF.

According to the embodiments, the method of manufacturing the thin film transistor substrate may further include removing a remaining portion of the sacrificial layer. The remaining portion of the sacrificial layer is removed by a wet etch process using a fluoride-based etchant.

The substrate includes a pixel area and a pad area formed adjacent to at least one side of the pixel area, and the second process and the third process are performed with respect to at least the pixel area.

The first process may further include forming a gate pad with the first conductive material in the pad area of the substrate, the second process may further include forming a data pad with the second conductive material in the pad area, and the third process may further include forming a gate pad electrode connected to the gate pad and a data pad electrode connected to the data pad with the third conductive material in the pad area.

The third process may further include partially removing the sacrificial layer and the second insulating layer using the photoresist layer pattern as the mask to form a second contact hole through which the data pad is partially exposed and partially removing the sacrificial layer, the second insulating layer, and the first insulating layer to form a third contact hole through which the gate pad is partially exposed.

The partially exposing the data and gate pads and the partially exposing the drain electrode may be performed by one process.

The third process may further include partially removing the photoresist layer pattern and the pixel electrode layer formed on the photoresist layer pattern to form the data pad electrode connected to the data pad through the second contact hole and the gate pad electrode connected to the gate pad through the third contact hole.

The forming the data pad electrode and the gate pad electrode and the forming the pixel electrode may be performed by one process.

According to the above, the thin film transistor substrate is formed through first to third processes using the first to third masks, respectively. In the third process using the third mask, the undercut is formed on the sacrificial layer to efficiently remove the third photoresist layer and a third conductive layer on the third photoresist layer by a lift-off process. Accordingly, contact failure or malfunction caused by an exposure of a semiconductor layer may be more effectively prevented from occurring than a case that the undercut is formed without forming the sacrificial layer.

BRIEF DESCRIPTION OF THE DRAWINGS

The above and other advantages of the present invention will become readily apparent by reference to the following detailed description when considered in conjunction with the accompanying drawings wherein:

FIGS. 5A to 5C are sectional views respectively taken along lines Va-Va', Vb-Vb', Vc-Vc' of FIGS. 4A to 4C;

FIGS. 6A to 6E are sectional views showing a second process of FIGS. 4B and 5B; and FIGS. 7A to 7I are cross-sectional views showing a third process of FIGS. 4C and 5C.

DETAILED DESCRIPTION

Figure 1:
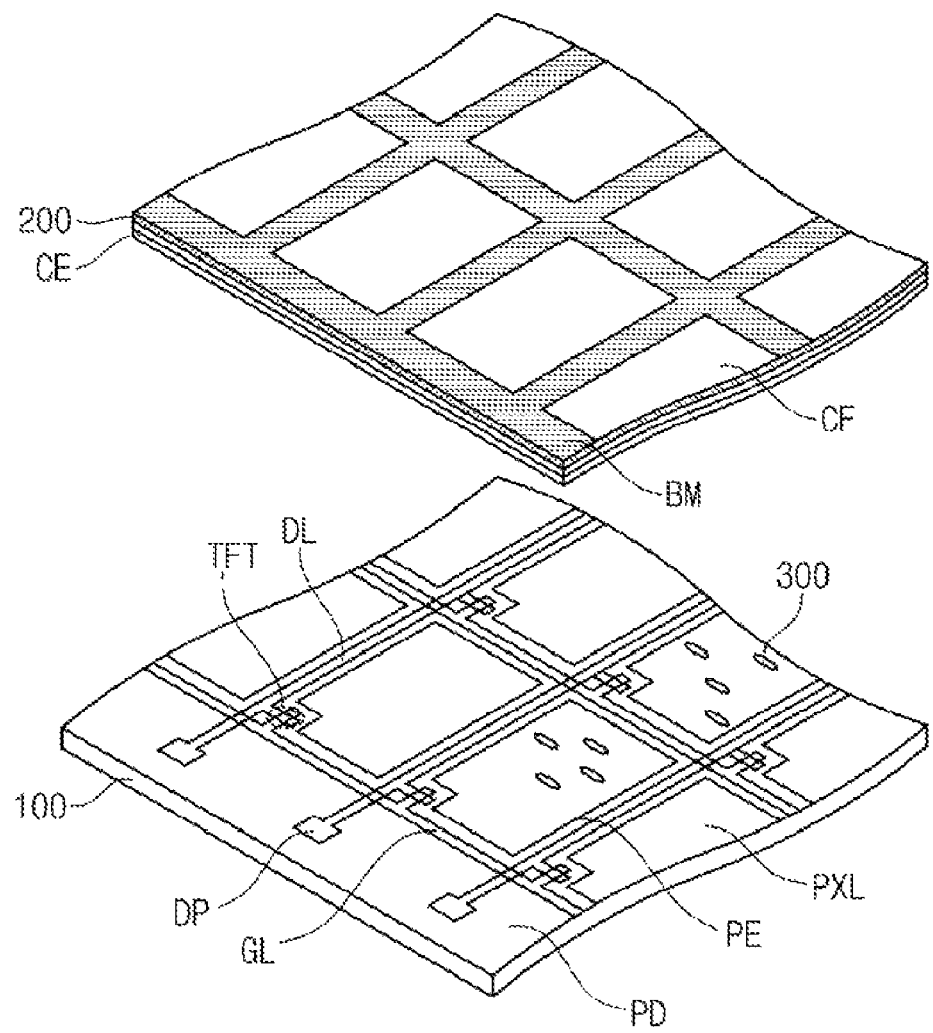
FIG. 1 is an exploded perspective view schematically showing a display apparatus according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is an exploded perspective view schematically showing a display apparatus according to an exemplary embodiment of the present invention. In the present exemplary embodiment, a liquid crystal display will be described as a representative example of the display apparatus.

Referring to FIG. 1, a liquid crystal display (LCD) includes a first substrate 100, a second substrate 200 opposite to the first substrate 100, and a liquid crystal layer 300 disposed between the first substrate 100 and the second substrate 200. The first substrate 100 includes a transparent material such as glass.

The first substrate 100 includes pixel areas PXL in which a plurality of pixels is formed and a pad area PD formed adjacent to at least one side of the pixel area PXL. In the pixel areas PXL, a plurality of gate lines GL, a plurality of data lines DL substantially perpendicular to the gate lines GL, a plurality of thin film transistors TFT each of which is connected to a corresponding gate line of the gate lines GL and a corresponding data line of the data lines DL, and a plurality of pixel electrodes PE each of which is connected to a drain electrode DE of a corresponding thin film transistors TFT. One end of each gate lines GL and one end each data lines DL extends to a corresponding pad area PD. The extended end of the gate lines GL serves as a gate pad (not shown) and the extended end of the data lines DL serves as a data pad DP.

The second substrate 200 includes color filters CF displaying red, green, and blue colors, a black matrix BM formed between the color filters CF to block a light that transmits between the color filters CF, and a common electrode CE applying an electric field to the liquid crystal layer 300 with the pixel electrode PE.

Hereinafter, the first substrate 100 may be referred to as a thin film transistor substrate since the thin film transistors TFT are formed thereon, and the second substrate 200 may be referred to as a color filter substrate since the color filters CF are formed thereon. In addition, the pixel areas PXL have the same structure and function, so one pixel area PXL will be described in detail.

In the display apparatus having the above-described structure, when the thin film transistor TFT is turned on in response to a driving signal provided through the gate line GL, an image signal applied through the data line DL is provided to the pixel electrode PE through the turned-on thin film transistor TFT. Thus, the electric field is formed between the pixel electrode PE and the common electrode CE to which a common voltage is applied. Liquid crystals in the liquid crystal layer 300 are driven by the electric field, so that an amount of the light transmitting through the liquid crystal layer 300 is varied, thereby displaying a desired image.

Figure 2:
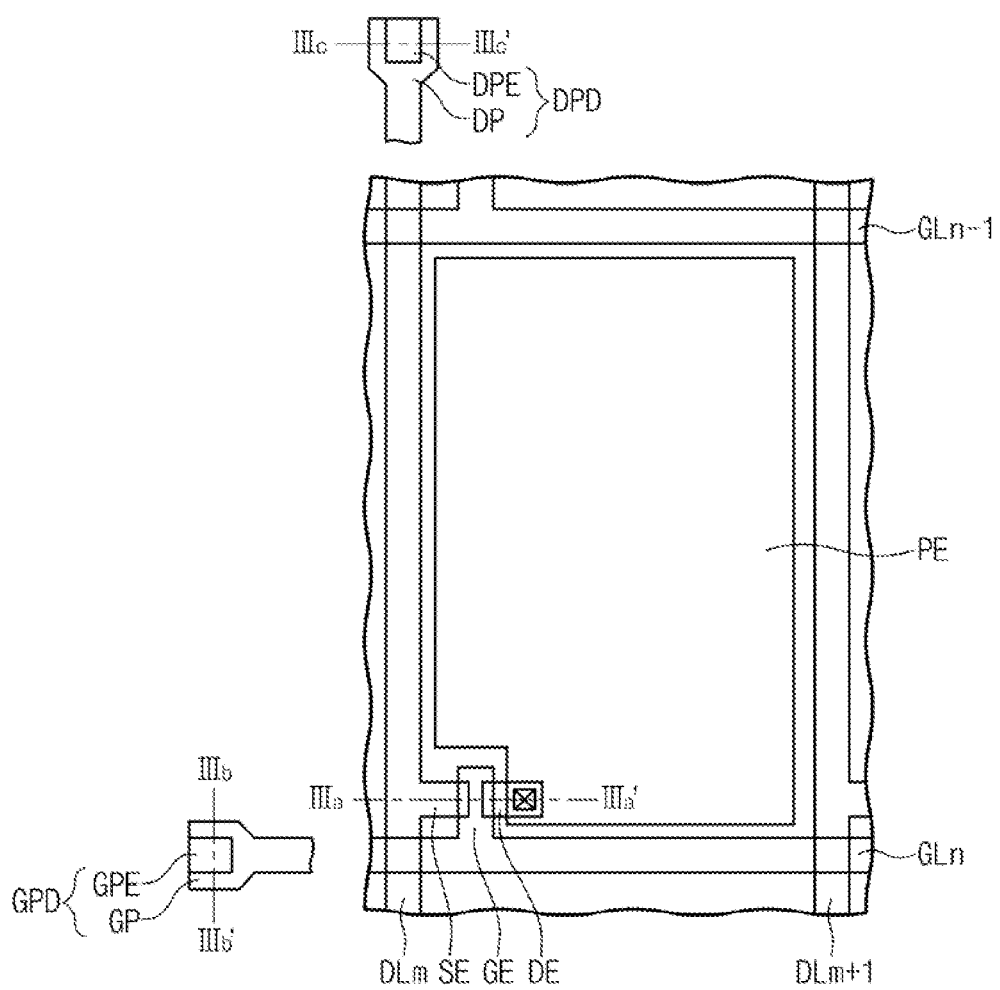
FIG. 2 is a plan view showing a portion of a thin film transistor substrate of a display apparatus according to an exemplary embodiment of the present invention.
Figure 3:
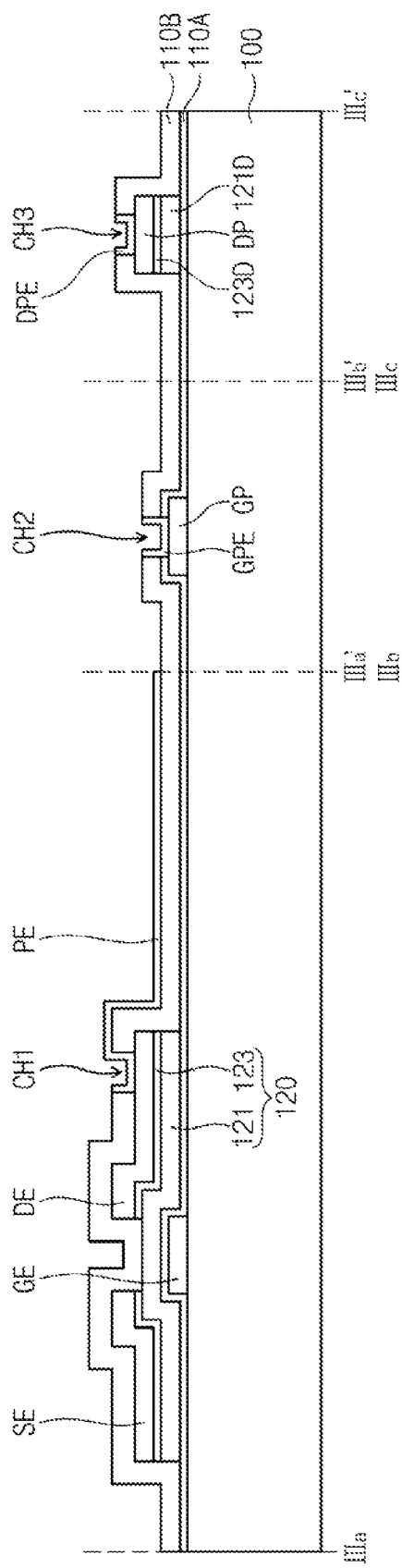
FIG. 3 is a sectional view taken along lines IIIa-IIIa', IIIb-IIIb', and IIIc-IIIc' of FIG. 2.

FIG. 2 is a plan view showing a thin film transistor substrate of a display apparatus according to an exemplary embodiment of the present invention. FIG. 3 is a sectional view taken along lines IIIa-IIIa', IIIb-IIIb', and IIIc-IIIc' of FIG. 2.

The thin film transistor substrate 100 includes (n+p) gate lines $GL_1, \ldots, GL_n, GL_{n+1}, \ldots, GL_{n+p}$ and (m+q) data lines $DL_1, \ldots, DL_m, DL_{m+1}, \ldots, DL_{m+q}$, and each pixel includes a corresponding gate line among the gate lines $GL_1, \ldots, GL_n, GL_{n+1}, \ldots, GL_{n+p}$ and a corresponding data line among the data lines $DL_1, \ldots, DL_m, DL_{m+1}, \ldots, DL_{m+q}$. For the convenience of explanation, a pixel including an (n−1)-th gate line $GL_{n-1}$, an n-th gate line $GL_n$, an m-th data line $DL_m$, and an (m+1)-th data line $DL_{m+1}$ has been illustrated in FIGS. 2 and 3. Each pixel has the same configuration.

The pixel includes the n-th gate line $GL_n$ and a gate electrode GE. The n-th gate line $GL_n$ extends in one direction on the first substrate 100. The gate electrode GE branches from the n-th gate line $GL_n$.

A semiconductor pattern 120 including an active layer 121 and an ohmic contact layer 123 is formed on the n-th gate line $GL_n$ while interposing a first insulating layer 110A therebetween. An m-th data line $DL_m$, a source electrode SE, and a drain electrode DE are formed on the first substrate 100 on which the semiconductor pattern 120 is formed. The m-th data line $DL_m$ extends in a different direction from the one direction to which the n-th gate line $GL_n$ extends and is arranged substantially perpendicular to the n-th gate line $GL_n$. The semiconductor pattern 120 serves as a conductive channel between the source electrode SE and the drain electrode DE.

The source electrode SE branches from the m-th data line $DL_m$. The drain electrode DE is spaced apart from the source electrode SE while interposing the gate electrode GE therebetween.

The pixel electrode PE is arranged on the source electrode SE and the drain electrode DE after a second insulating layer 110B is formed over the first substrate 100. The pixel electrode PE is electrically connected to the drain electrode DE through a first contact hole CH1 formed through the second insulating layer 110B.

The gate electrode GE, the semiconductor pattern 120, the source electrode SE, and the drain electrode DE form the thin film transistor TFT, and a pixel voltage is applied to the pixel electrode PE that is connected to the drain electrode DE according to an operation of the thin film transistor TFT.

A gate pad part GPD and a data pad part DPD are arranged at either one side or both sides of the thin film transistor substrate 100. The gate pad part GPD includes a gate pad GP and a gate pad electrode GPE connected to the gate pad GP through a second contact hole CH2 formed through the second insulating layer 110B, and the data pad part DPD includes a data pad DP and a data pad electrode DPE connected to the data pad DP through a third contact hole CH3 formed through the second insulating layer 110B.

The n-th gate line $GL_n$ and the m-th data line $DL_m$ extend to the pad area PD to be connected to the gate pad GP and the data pad DP, respectively, and receive a driving signal and an image signal from an external driving circuit (not shown) through the gate pad electrode GPE and the data pad electrode DPE, respectively. The driving signal and the image signal from the external driving circuit (not shown) are transmitted to the n-th gate line $GL_n$ and the m-th data line $DL_m$, respectively.

The thin film transistor substrate 100 according to the present exemplary embodiment may be manufactured by a photolithography process using a first mask, a second mask, and a third mask, and the manufacturing process will be described as follows.

Figure 4A:
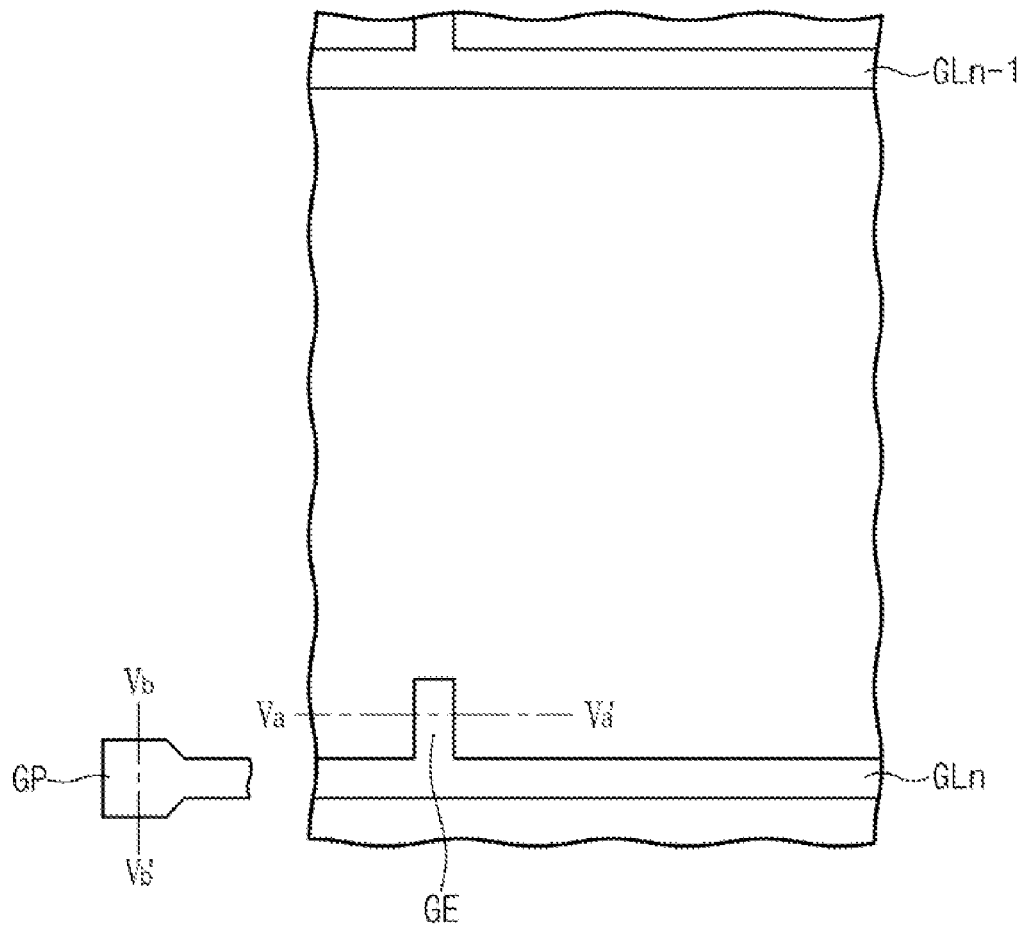
FIGS. 4A to 4C are plan views sequentially showing a manufacturing process of a thin film transistor substrate of FIG. 2.
Figure 4B:
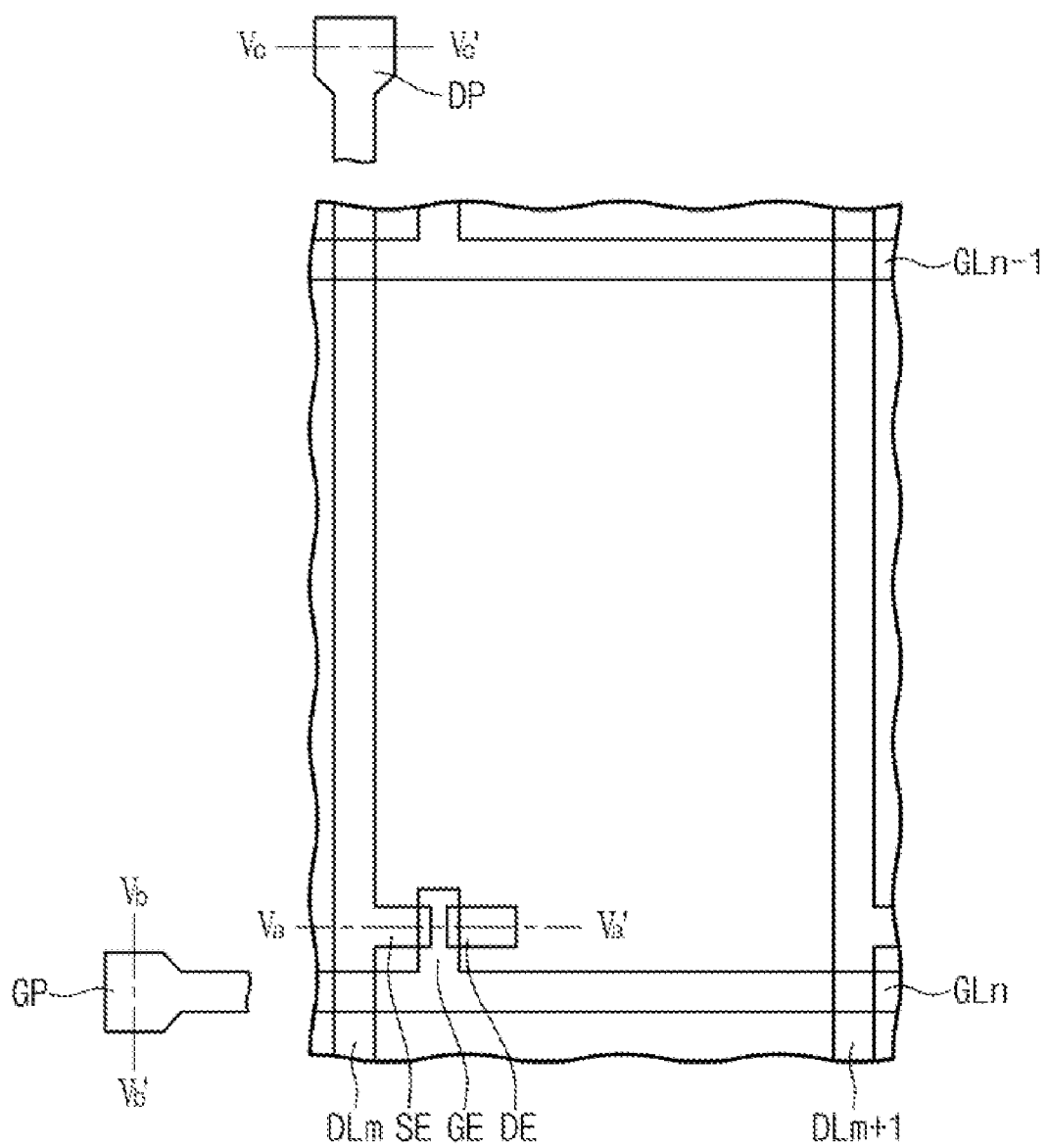
Figure 4C:
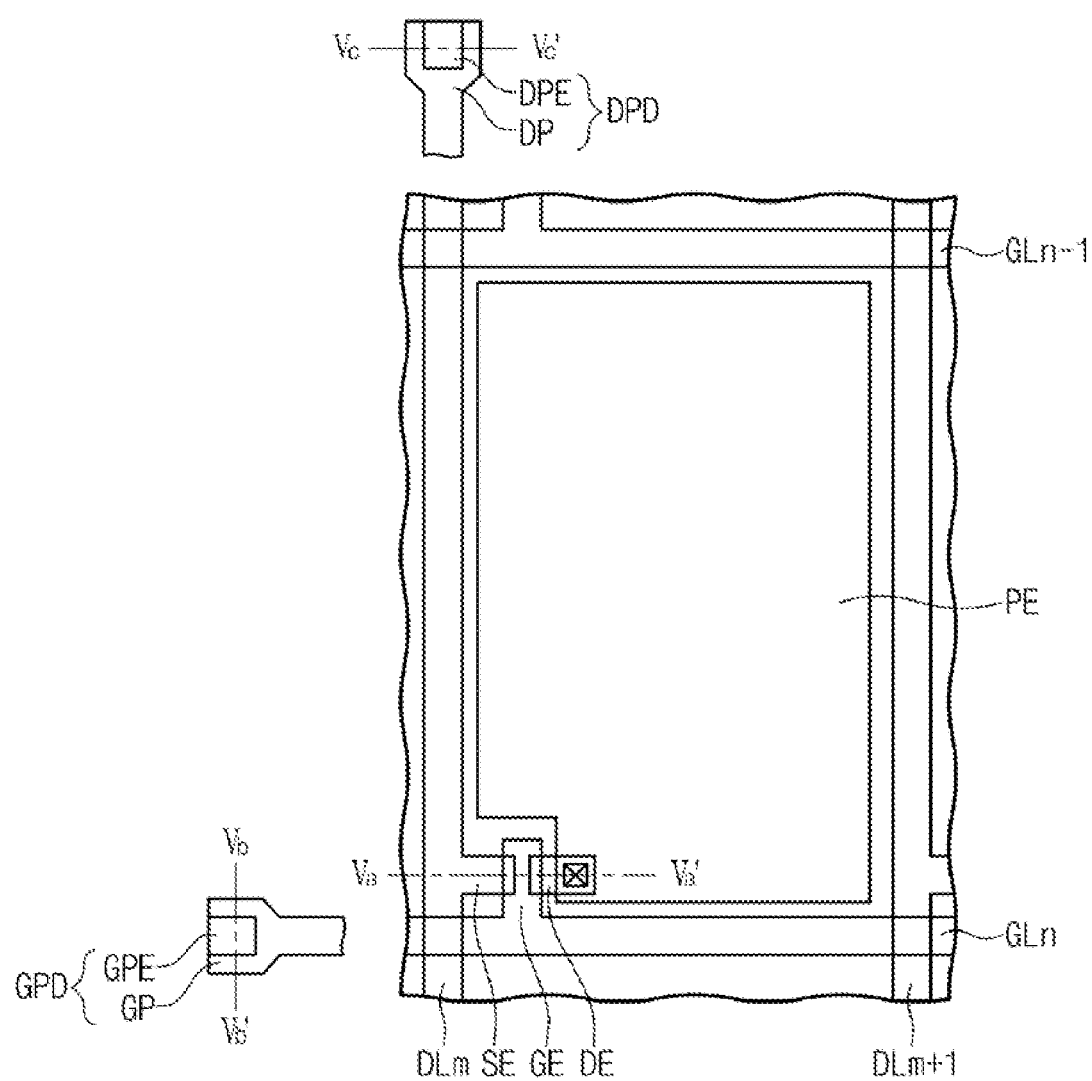
Figure 5A:
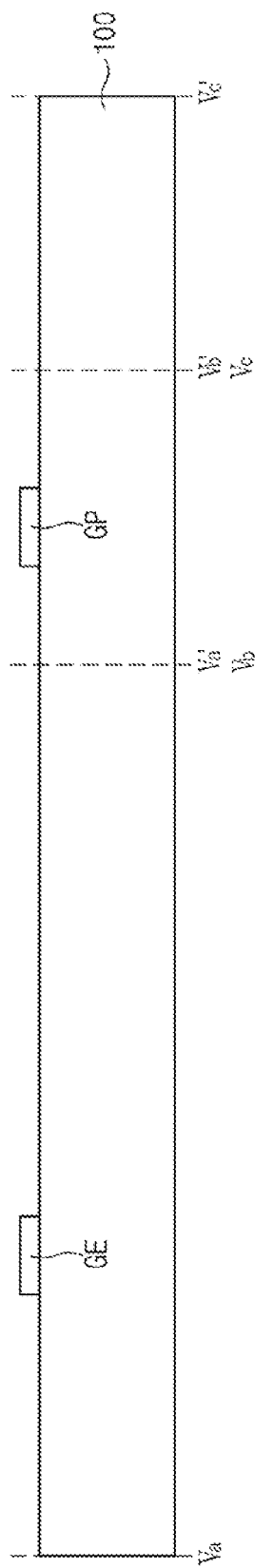
Figure 5B:
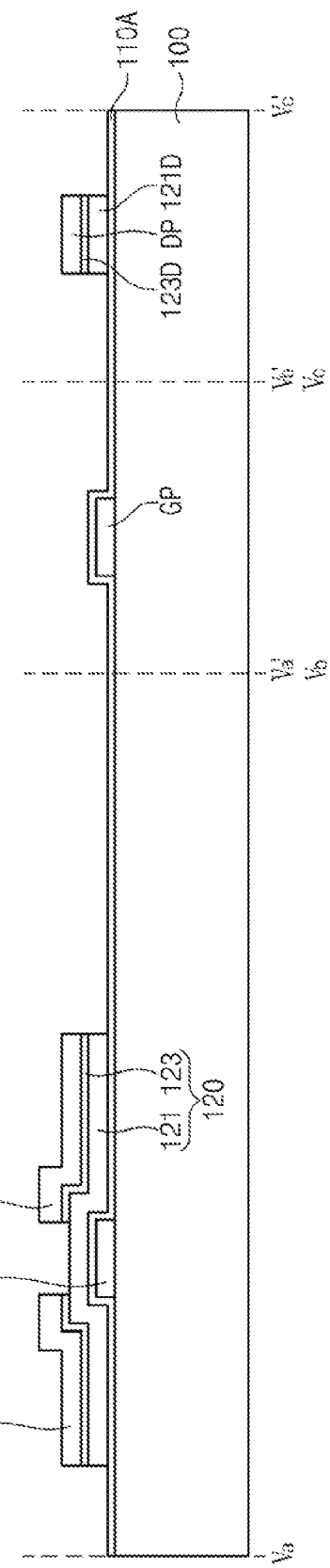

FIGS. 4A to 4C are plan views sequentially showing a manufacturing process of the thin film transistor substrate of FIG. 2, and FIGS. 5A to 5C are sectional views respectively taken along lines Va-Va', Vb-Vb', Vc-Vc' of FIGS. 4A to 4C. In FIGS. 5A to 5C, the pixel area PXL, the gate pad part GPD, and the data pad part DPD have been sequentially described from the left to the right.

As shown in FIGS. 4A and 5A, a gate line pattern is formed with a first conductive material on the first substrate 100 including a transparent insulating material. The gate line pattern includes the gate electrode GE, the (n−1)-th gate line $GL_{n-1}$, the n-th gate line $GL_n$, and the gate pad GP. The gate electrode GE, the (n−1)-th gate line $GL_{n-1}$, and the n-th gate line $GL_n$ are formed in the pixel area PXL of the first substrate 100, and the gate pad GP is formed in the pad area PD of the first substrate 100.

In order to form the gate line pattern, the first conductive material is deposited over an entire surface of the first substrate 100 to form a first conductive layer (not shown) and the first conductive layer (not shown) is patterned by a photolithography process (hereinafter, referred to as a first process) using a first mask (not shown).

In the present exemplary embodiment, the first conductive material may include metals, such as copper (Cu), molybdenum (Mo), aluminum (Al), tungsten (W), and chromium (Cr) and the first conductive layer (not shown) may have a single layer structure, a multi-layer structure, or an alloy layer using the first conductive material. For example, a triple-layer of molybdenum-aluminum-molybdenum (Mo—Al—Mo) or an alloy layer of molybdenum-aluminum (Mo—Al) may be used.

Then, as shown in FIGS. 4B and 5B, the first insulating layer 110A, an amorphous silicon thin film 121L (refer to FIG. 6A), an n+ amorphous silicon thin film 123L (refer to FIG. 6A), and a second conductive layer 130 (refer to FIG. 6A) are sequentially deposited over the entire surface of the first substrate 100 on which the gate electrode GE, the (n−1)-th gate line $GL_{n-1}$, and the gate pad GP are formed. Then, the amorphous silicon thin film 121L (refer to FIG. 6A) and the n+ amorphous silicon thin film 123L (refer to FIG. 6A), and the second conductive layer 130 (refer to FIG. 6A) are selectively patterned by a photolithography process (hereinafter, referred to as a second process) using a second mask MSK2 (refer to FIG. 6A) to substantially simultaneously form the semiconductor pattern 120 including the amorphous silicon thin film and a data line pattern including a second conductive material on the gate electrode GE.

The data line pattern includes the source electrode SE, the drain electrode DE, the m-th data line $DL_m$, the (m+1)-th data line $DL_{m+1}$, and the data pad DP. The source electrode SE, the drain electrode DE, the m-th data line $DL_m$, and the (m+1)-th data line $DL_{m+1}$ are formed in the pixel area PXL of the first substrate 100 and the data pad DP is formed in the pad area PD of the first substrate 100.

The semiconductor pattern 120 includes the active layer 121 including the amorphous silicon thin film and the ohmic contact layer 123 formed on the active layer 121. The ohmic contact layer 123 is formed by patterning the n+ amorphous silicon thin film 123L and is patterned to have the same shape as the source electrode SE and the drain electrode DE. Accordingly, certain areas of the active layer 121 may make ohmic contact with the source and drain electrodes SE and DE.

In addition, the data pad DP including the second conductive layer 130 is formed in the pad area PD by the second process, and an amorphous silicon thin film pattern 121D including the amorphous silicon and the n+ amorphous silicon thin film pattern 123D including the n+ amorphous silicon remain under the data pad DP to have the same shape as the data pad DP.

In the present exemplary embodiment, the semiconductor pattern 120, the source electrode SE, the drain electrode DE, and the data pad DP may be substantially simultaneously formed by one photolithography process (the second process) using a diffraction exposure method.

Hereinafter, the second process will be described in detail with reference to FIGS. 6A to 6E.

FIGS. 6A to 6E are sectional views showing the second process that substantially simultaneously forms the semiconductor pattern 120, the source electrode SE, the drain electrode DE, and the data pad DP of FIGS. 4B and 5B.

Figure 6A:
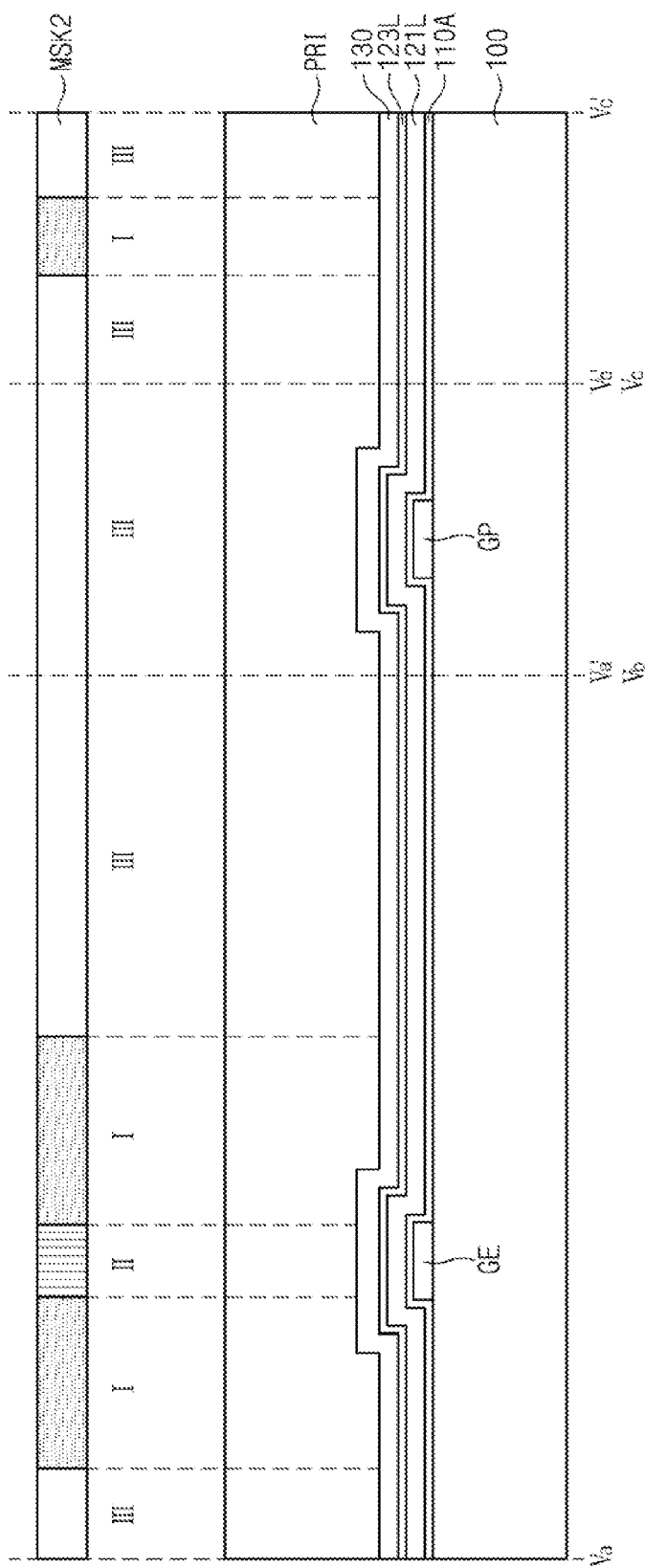

As shown in FIG. 6A, the first insulating layer 110A, the amorphous silicon thin film 121L, the n+ amorphous silicon thin film 123L, and the second conductive layer 130 are sequentially deposited over the entire surface of the first substrate 100 on which the gate electrode GE, the (n−1)-th gate line $GL_{n-1}$, and the gate pad GP are formed.

The second conductive layer 130 is formed with the second conductive material and the second conductive material may include metals, such as copper (Cu), molybdenum (Mo), aluminum (Al), tungsten (W), and chromium (Cr). The second conductive layer 130 may have a single layer structure, a multi-layer structure, or an alloy layer using the second conductive material.

Then, a first photoresist layer PRI including a photoresist material is formed over the entire surface of the first substrate 100 and a light is irradiated onto the first photoresist layer PRI through the second mask MSK2.

The second mask MSK2 is configured as a diffraction exposure mask of which a first area I blocks the irradiated light, a second area II employs a slit pattern to partially block the light, and a third area III transmits the irradiated light, and the light transmitted through the second mask MSK2 is irradiated onto the first photoresist layer PRI. For the convenience of explanation, upper portions of the first substrate 100, which are respectively corresponding to the first area I, the second area II, and the third area III, will be referred to as the first, second, and third areas I, II, and III.

Figure 6B:
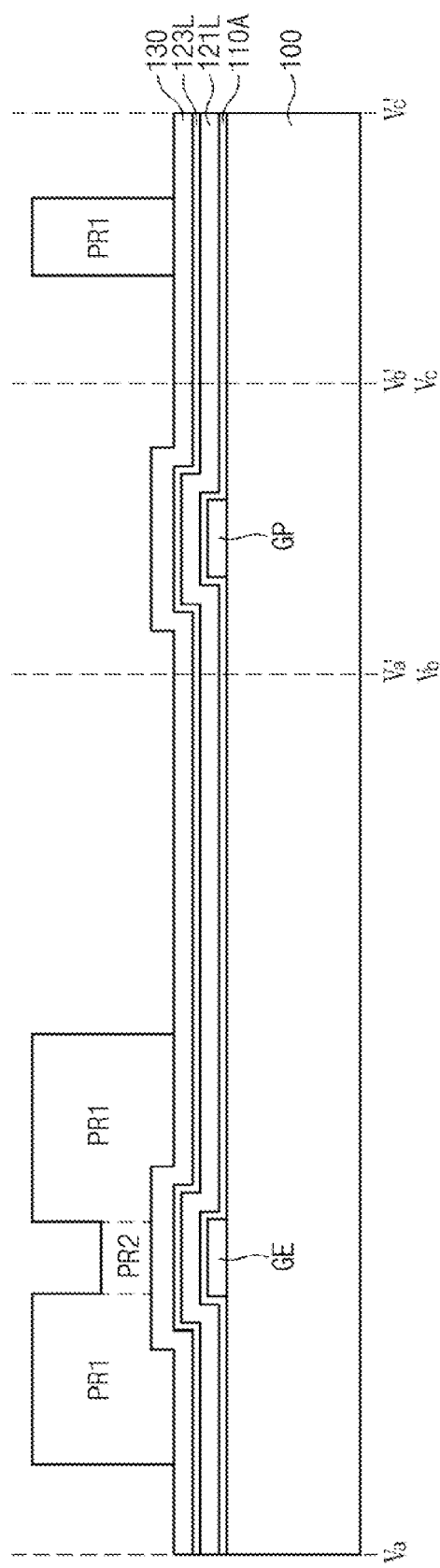

As shown in FIG. 6B, when the first photoresist layer PRI exposed to the light through the second mask MSK2 is developed, a first photoresist layer pattern PR1 having a thickness remains in the first area I of the first substrate 100 corresponding to the the first area I of the second mask MSK2, where the light is blocked, and a second photoresist layer pattern PR2 having a thickness remains in the second area II of the first substrate 100 corresponding to the second area II of the second mask MSK2, where the light is partially blocked, and the first photoresist layer PRI is removed in the third area III of the first substrate 100 corresponding to the third area III of the second mask MSK2, where the light is transmitted, to expose a surface of the second conductive layer 130 through the third area III of the first substrate 100.

Since the exposure amount of the light in the second area II in which the slit pattern is adopted is larger than the exposure amount of the light in the first area I in which the light is blocked, the second photoresist layer pattern PR2 has the thickness thinner than that of the first photoresist layer pattern PR1.

In the present exemplary embodiment, a positive photoresist has been used such that the exposed portion of the first photoresist layer PRI is removed, however, it should not be limited thereto or thereby. That is, in another exemplary embodiment of the present invention, a negative photoresist may be used such that an unexposed portion of the first photoresist layer PRI is removed.

As shown in FIG. 6C, the amorphous silicon thin film 121L, the n+ amorphous silicon thin film 123L, and the second conductive layer 130 formed under the photoresist layer pattern are selectively removed using the first photoresist layer pattern PR1 and the second photoresist layer pattern PR2 as a mask. Thus, the active layer 121 including the amorphous silicon thin film is formed on the n-th gate line $GL_n$, and the n+ amorphous silicon thin film pattern 123' and the second conductive layer pattern 130' including the second conductive material are sequentially formed on the active layer 121.

The data pad DP including the second conductive layer 130 is formed in the data pad part DPD of the first substrate 100, and the amorphous silicon thin film pattern 121D including the amorphous silicon and the n+ amorphous silicon thin film pattern 123D including the n+ amorphous silicon are patterned and remained under the data pad DP.

Figure 6D:
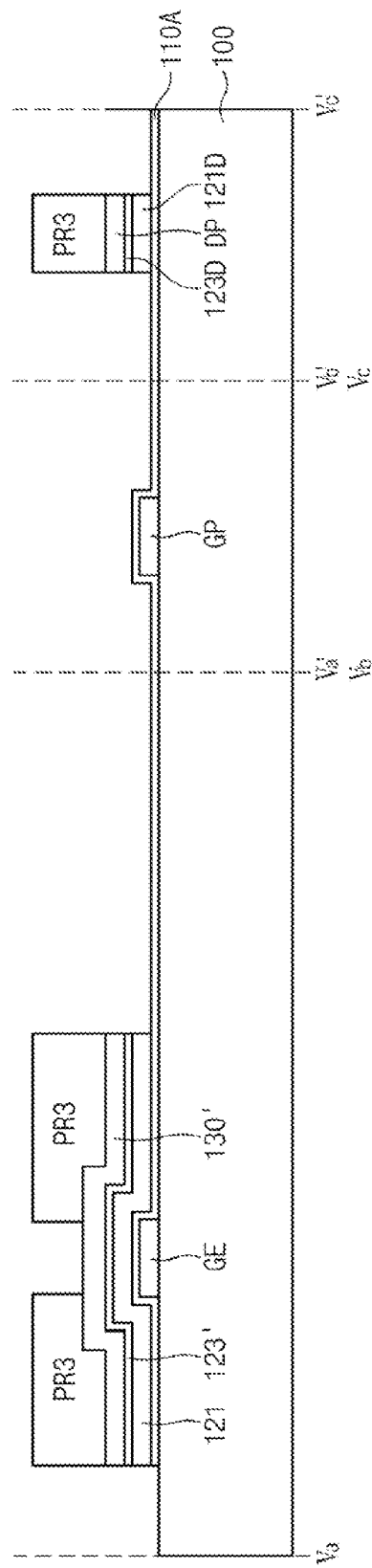

Then, when a portion of the first photoresist layer pattern PR1 and the second photoresist layer pattern PR2 are removed by an ashing process or an etch-back process, as shown in FIG. 6D, an upper portion of the active layer 121, that is, the second photoresist layer pattern PR2 of the second area II to which the diffraction exposure is applied, is completely removed to partially expose a surface of the second conductive layer pattern 130'.

The first photoresist layer pattern PR1 is removed by the thickness of the second photoresist layer pattern PR2 to form a third photoresist layer pattern PR3, and the third photoresist layer pattern PR3 remains only in the third area III.

As shown in FIG. 6E, the second conductive layer pattern 130' and the ohmic contact layer 123 that are arranged on the active layer 121 are partially removed to form a channel part using the third photoresist layer pattern PR3 as a mask, and then, the remaining third photoresist layer pattern PR3 is removed.

As a result, the ohmic contact layer 123 including the n+ amorphous silicon thin film, the source electrode SE, and the drain electrode DE electrically connected to the source electrode SE through the ohmic contact layer 123 are substantially simultaneously formed above the gate electrode GE of the pixel area PXL.

As shown in FIGS. 4C and 5C, the first insulating layer 110A is formed on the first substrate 100 on which the source electrode SE and the drain electrode DE are formed. Then, when a photolithography process (hereinafter, referred to as a third process) using a third mask MSK3 is performed, the pixel electrode PE connected to the drain electrode DE, and the gate pad electrode GPE electrically connected to the gate pad GP, and the data pad electrode DPE electrically connected to the data pad DP are formed.

In the third process, the photoresist layer pattern is formed using the third mask MSK3 as a diffraction mask and the contact hole is formed by using the photoresist layer pattern. Also, a third conductive layer 150 is formed with a third conductive material over an entire surface of the first substrate 100 including the photoresist layer pattern PR3 (shown in FIG. 7G), and the photoresist layer pattern PR3 (shown in FIG. 7G) and the third conductive layer formed on the photoresist layer pattern PR3 (shown in FIG. 7G) are removed by a lift-off process to form the pixel electrode PE. A sacrificial layer may be formed on the second insulating layer 110B to easily remove the photoresist layer pattern PR3 (shown in FIG. 7G).

Detailed descriptions of the above third process will be described with reference to FIGS. 7A to 7I.

FIGS. 7A to 7I are cross-sectional views showing the third process of FIGS. 4C and 5C.

Figure 7A:
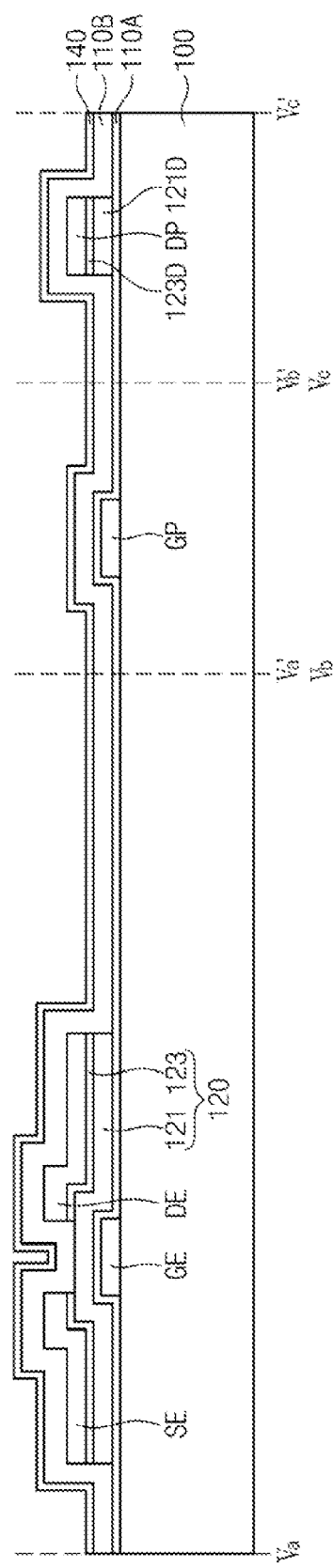

As shown in FIG. 7A, the second insulating layer 110B is formed over the entire surface of the first substrate 100 on which the source electrode SE and the drain electrode DE are formed and a sacrificial layer 140 is formed on the second insulating layer 110B.

The sacrificial layer 140 is formed under the photoresist layer pattern, which will be described later, and the sacrificial layer 140 is used to allow the photoresist layer pattern to lift off.

The sacrificial layer 140 includes a material that may be removed by a dry etch process or a wet etch process, and more particularly, the sacrificial layer 140 includes a material that may be easily removed by a certain etchant or a cleaning solution. For example, the sacrificial layer 140 may be formed with a metal, such as titanium having a high etch rate with respect to a fluoride-based etchant such as HF. The material used for the sacrificial layer 140 should not be limited thereto. That is, molybdenum may be used to form the sacrificial layer 140. In a case that the metals such as titanium and molybdenum are used to form the sacrificial layer 140, the sacrificial layer 140 may be formed in a single layer of titanium, a single layer of molybdenum, a multi-layer of titanium and molybdenum, or an alloy of titanium and molybdenum.

The sacrificial layer 140 may have a thickness of from about 500 Å to about 3000 Å. When the sacrificial layer 140 has a thickness that is thinner than 500 Å, an undercut is not sufficiently formed under the photoresist layer pattern. On the contrary, when the sacrificial layer 140 has a thickness that is thicker than 3000 Å, the sacrificial layer 140 is difficult to be removed completely.

Figure 7B:
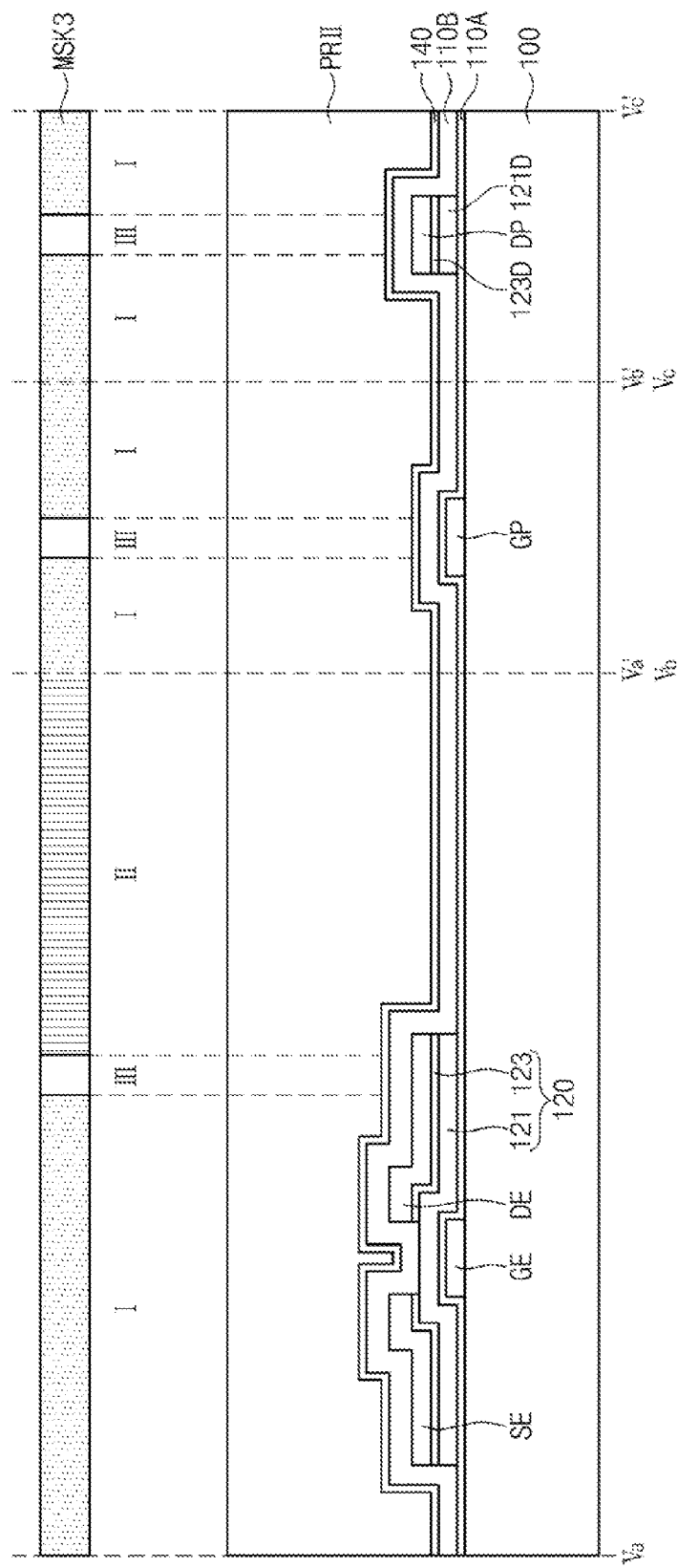
Figure 7C:
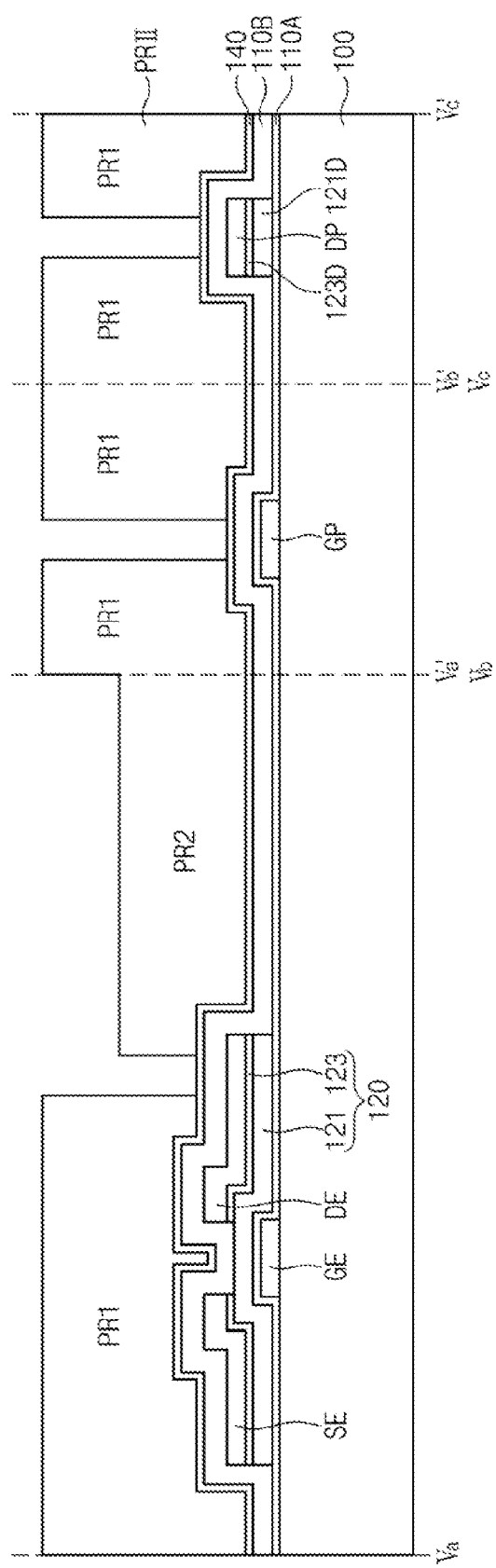

As shown in FIG. 7B, the second photoresist layer PRII is formed with a photoresist material on the sacrificial layer 140 and a light is irradiated onto the second photoresist layer PRII through the third mask MSK3.

Similar to the second mask MSK2, the third mask MSK3 is configured to have a first area I blocking the light, a second area II employing a slit pattern to partially block the light, and a third area III transmitting the light, and only the light transmitted through the third mask MSK3 is irradiated onto the second photoresist layer PRII.

When the second photoresist layer PRII exposed to the light through the third mask MSK3 is developed, the first photoresist layer pattern PR1 having a certain thickness remains in an area where the light is blocked by the first area I of the third mask MSK3 and a second photoresist layer pattern PR2 having a certain thickness remains in an area where the light is partially blocked by the second area II of the third mask MSK3, and the second photoresist layer PRII is removed in an area where the light is not blocked, to thereby partially expose the surface of the sacrificial layer 140.

Since the exposure amount of the second area II in which the slit pattern is employed is larger than the exposure amount of the first area I in which the light is blocked, the second photoresist layer pattern PR2 has a thickness that is thinner than that of the first photoresist layer pattern PR1.

In the present exemplary embodiment, a positive photoresist has been used such that the exposed portion of the second photoresist layer PRII is removed, however, it should not be limited thereto or thereby. That is, in another exemplary embodiment of the present invention, a negative photoresist may be used such that an unexposed portion of the second photoresist layer PRII is removed.

Then, as shown in FIG. 7D, when the sacrificial layer 140 and the second insulating layer 110B each corresponding to the third area III are removed using the first photoresist layer pattern PR1 and the second photoresist layer pattern PR2 as a mask, a first contact hole CH1 through which the drain electrode DE is partially exposed is formed.

Meanwhile, in the pad part, when the sacrificial layer 140, the second insulating layer 110B, and the first insulating layer 110A each corresponding to the third area III are removed using the first photoresist layer pattern PR1 as the mask, a second contact hole CH2 partially exposing the gate pad GP and a third contact hole CH3 partially exposing the data pad DP are formed in the pad part.

A portion of the sacrificial layer 140, that is, the sacrificial layer 140 in the third area III may be removed by a dry etch process using a chloride-based compound. The chloride-based compound may include at least one of $Cl_2$ and $BCl_3$. The second insulating layer 110B and a portion of the first insulating layer 110A may be removed by a dry etch process using a fluoride-based compound. The fluoride-based compound may include at least one of $SF_6$ and $CF_4$.

Figure 7E:
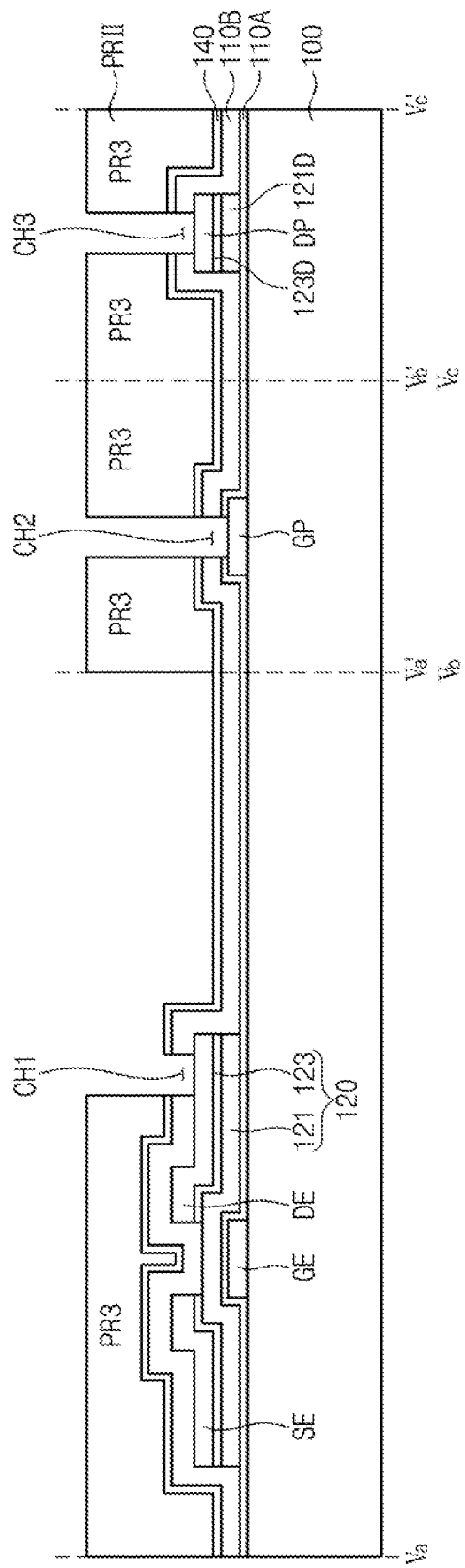

Referring to FIG. 7E, when the portion of the second photoresist layer pattern PR2 and the first photoresist layer pattern PR1 are removed by the ashing process (or the etch-back process), the second photoresist layer pattern PR2 of the second area II in which the diffraction exposure is applied is completely removed, to thereby partially expose the sacrificial layer 140. The portion of the exposed sacrificial layer 140 serves as an area in which the pixel electrode PE is formed.

Consequently, the first photoresist layer pattern PR1 is removed by the thickness of the second photoresist layer pattern PR2 to form the third photoresist layer pattern PR3, and the third photoresist layer pattern PR3 remains only in the first area I.

After that, when the first substrate 100 on which the third photoresist layer pattern PR3 remains is cleaned to remove the exposed sacrificial layer 140 and a portion of the sacrificial layer 140 formed under the third photoresist layer pattern PR3, as shown in FIG. 7F, the second insulating layer 110B is exposed in the second area II in which the diffraction exposure is applied, and the sacrificial layer 140 formed under the third photoresist layer pattern PR3 is etched along an edge of the third photoresist layer pattern PR3. Thus, the undercut UC is formed under the third photoresist layer pattern PR3 by removing the portion of the sacrificial layer 140.

In order to form the undercut UC by removing the portion of the sacrificial layer 140, the first substrate 100 is wet-cleaned using a cleaning solution or an etchant having a high reactivity with respect to the sacrificial layer 140, so that the sacrificial layer 140 may be over-etched compared to the other electrodes. For example, if the drain electrode DE partially exposed the first contact hole CH1 is formed with molybdenum and the sacrificial layer 140 is formed with titanium, a fluoride-based cleaning solution or etchant may be used to allow the sacrificial layer 140 to have a higher etch selectivity with respect to the solution or etchant than the drain electrode DE. The fluoride-based cleaning solution or etchant may include HF. Therefore, the sacrificial layer 140 may be etched without etching the exposed portion of the drain electrode DE, and thus the undercut UC may be formed under the third photoresist layer pattern PR3.

The first substrate 100 on which the third photoresist layer pattern PR3 is formed may be processed through a separate etch process in order to remove the portion of the sacrificial layer 140, however, in the present exemplary embodiment, the first substrate 100 may be etched using the cleaning solution during the cleaning process that does not require an additional etch process, thereby reducing manufacturing cost and time.

The sacrificial layer 140 is formed with a different material from the drain electrode DE. This is because the portion of the drain electrode DE is exposed through the first contact hole CH1 during the etching process of the sacrificial layer 140. That is, if the drain electrode DE is formed with the same material as the sacrificial layer 140, the drain electrode DE may be etched during the etching process for the sacrificial layer 140. Therefore, it is desirable for the drain electrode DE to be formed with a material having a higher etch resistance than the sacrificial layer 140.

According to the present exemplary embodiment, when the sacrificial layer 140 is formed with titanium to have a thickness of about 2,000 Å and cleaned with HF (100:1) for about 60 seconds, the sacrificial layer 140 is inwardly recessed, thereby forming the undercut UC having a width of about 1.039 μm to about 1.241 μm. When assuming that the sacrificial layer 140 is not formed, the undercut is required to lift-off the third photoresist layer pattern PR3 during the process in which the first to third contact holes CH1, CH2, and CH3 are formed through the second insulating layer 110B. However, when the undercut is formed by etching the second insulating layer 110B, the first and second insulating layers 110A and 110B are substantially simultaneously etched and the undercut is insufficiently formed since the first insulating layer 110A has a similar etch selectivity to that of the second insulating layers 110A and 110B. If the first and second insulating layers 110A and 110B are etched more than an amount required to sufficiently form the undercut, the undercut may be formed in the semiconductor layer under the second conductive layer 130. However, in the present exemplary embodiment, the undercut may be easily formed under the third photoresist layer pattern PR3 by forming the sacrificial layer 140, thereby preventing the above-mentioned defects.

Figure 7G:
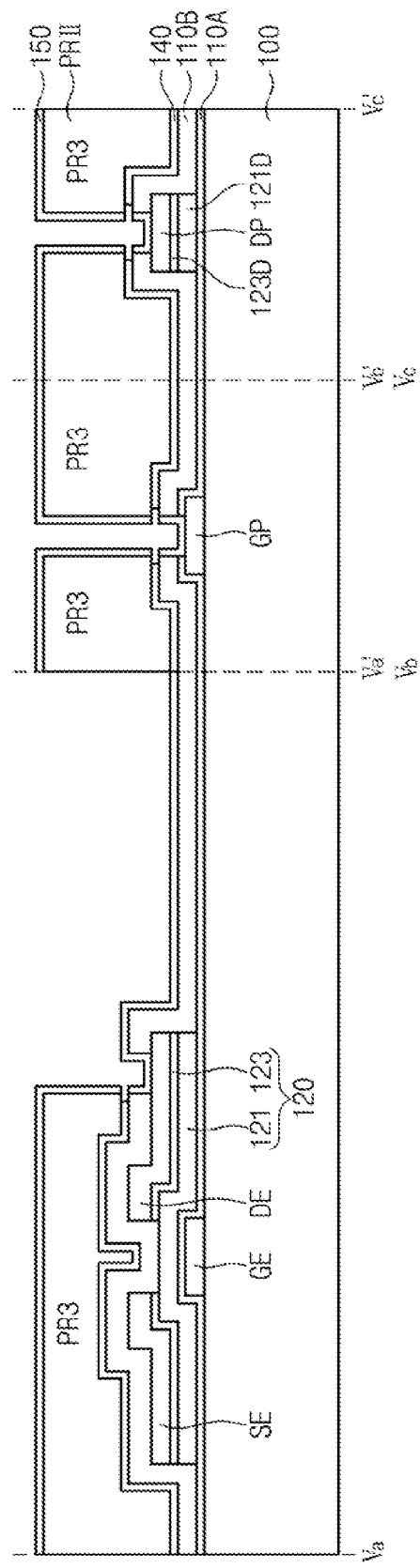

As shown in FIG. 7G, the third conductive layer 150 is formed over the entire surface of the first substrate 100 on which the third photoresist layer pattern PR3 remains. The third photoresist layer pattern PR3 on the undercut UC is outwardly protruded more than the sacrificial layer 140 in which the undercut UC is formed, so that the third conductive layer 150 is not formed at a position corresponding to the undercut UC formed at a lower portion of the third photoresist layer pattern PR3. Thus, although the third conductive layer 150 is formed over the entire surface of the first substrate 100, the third conductive layer 150 is cut away along the area in which the undercut UC is formed.

The third conductive layer 150 may include a transparent conductive material having a high transmittance, such as indium tin oxide ITO or indium zinc oxide IZO, to form the pixel electrode PE, the gate pad electrode GPE, and the data pad electrode DPE.

Then, the third photoresist layer pattern PR3 and the third conductive layer 150 formed on the third photoresist layer pattern PR3 are removed by the lift-off method to expose the remaining portion of the sacrificial layer 140, and the third conductive layer 150 remains in areas corresponding to the second area II and the third area III except for the area where the third photoresist layer pattern PR3 is formed. Therefore, the remaining third conductive layer 150 forms the pixel electrode PE connected to the drain electrode DE through the first contact hole CH1 in the pixel area PXL, and forms the gate pad electrode GPE connected to the gate pad GP through the second contact hole CH2 and the data pad electrode DPE connected to the data pad DP through the third contact hole CH3 in the pad part.

The third photoresist layer pattern PR3 and the third conductive layer 150 on the third photoresist layer pattern PR3 may be substantially simultaneously removed by a strip process applied to the third photoresist layer pattern PR3. The third photoresist layer pattern PR3 is easily removed by the undercut UC of the sacrificial layer 140 formed under the third photoresist layer pattern PR3.

As shown in FIG. 7I, the remaining portion of the sacrificial layer 140 is removed. The remaining portion of the sacrificial layer 140 may be removed by a wet etch process using the fluoride-based etchant such as HF. In this case, since the sacrificial layer 140 is formed with the conductive material including a single layer of titanium, a single layer of molybdenum, a multi-layer of titanium and molybdenum, or an alloy of titanium and molybdenum, if it is necessary, the sacrificial layer 140 may serve as an element in other parts, such as a signal line, after patterned by a photolithography process.

The thin film transistor substrate formed by the above described process is coupled with a color filter substrate (not shown), and the color filter substrate includes a black matrix to prevent a light from leaking through the thin film transistor, the gate line, and the data line and color filters to display red, green, and blue colors.

As described above, the thin film transistor substrate may be formed through three processes using the first to third masks, and the third photoresist layer pattern PR3 and the third conductive layer 150 on the third photoresist layer pattern PR3 may be effectively removed by the lift-off process since the undercut UC is formed in the sacrificial layer 140 during the third process using the third mask MSK3.

In addition, the sacrificial layer 140 is formed on the second insulating layer 110B and over-etched to form the undercut CU having a width that is equal to or larger than 0.2 μm under the third photoresist layer pattern PR3. Thus, the third photoresist layer pattern PR3 and the third conductive layer 150 on the third photoresist layer pattern PR3 may be effectively removed.

The liquid crystal display has been described as a representative display apparatus in the exemplary embodiments, but the thin film transistor substrate should not be limited to the liquid crystal display. In other words, the thin film transistor substrate may be applied to various display apparatuses such as organic light emitting display, electrophoretic display, plasma display panel, microelectromechanical system, etc.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a thin film transistor, the method comprising:
    a first process of forming a gate line pattern including a gate line and a gate electrode with a first conductive material on a substrate using a first mask;
    a second process of forming a first insulating layer on the substrate and forming a data line pattern including a data line, a source electrode, and a drain electrode with a second conductive material on the insulating layer using a second mask; and
    a third process of forming a second insulating layer on the substrate and forming a pixel electrode connected to the drain electrode with a third conductive material on the second insulating layer,
    wherein the third process further comprises:
        forming a sacrificial layer on the second insulating layer;
        forming a photoresist layer on the sacrificial layer;
        exposing the photoresist layer to a light and developing the photoresist layer to form a photoresist layer pattern:
        partially removing the sacrificial layer and the second insulating layer using the photoresist layer pattern as a mask to partially expose the drain electrode;
        etching the substrate to form an undercut on the sacrificial layer under the photoresist layer pattern;
        forming a pixel electrode layer with the third conductive material over an entire surface of the substrate; and
        removing the photoresist layer pattern and the pixel electrode layer on the photoresist layer pattern to form the pixel electrode.

2. The method of claim 1, wherein the forming of the photoresist layer pattern comprises:
    exposing the photoresist layer to the light through a diffraction mask; and
    developing the photoresist layer to form a first photoresist layer pattern having a first thickness in a first area and a second photoresist layer pattern having a second thickness thinner than the first thickness in a second area different from the first area.

3. The method of claim 2, wherein the removing of the sacrificial layer and the second insulating layer comprises partially removing the sacrificial layer and the second insulating layer using the first and second photoresist layer patterns as the mask to form a first contact hole through which the drain electrode is partially exposed.

4. The method of claim 3, wherein the pixel electrode is connected to the drain electrode through the first contact hole.

5. The method of claim 3, wherein the sacrificial layer is partially removed by a dry etch process using a chloride-based compound, and the second insulating layer is partially removed by a dry etch process using a fluoride-based compound.

6. The method of claim 5, wherein the chloride-based compound is an etchant including at least one of $Cl_2$ and $BCl_3$.

7. The method of claim 5, wherein the fluoride-based compound is an etchant including at least one of $SF_6$ and $CF_4$.

8. The method of claim 3, wherein the forming of the undercut on the sacrificial layer comprises:
    removing the second photoresist layer pattern and a portion of the first photoresist layer pattern to form a third photoresist layer pattern having a third thickness; and
    wet-cleaning the substrate using a fluoride-based cleaning solution to partially remove the sacrificial layer formed under the first photoresist layer pattern.

9. The method of claim 8, wherein the fluoride-based cleaning solution comprises HF.

10. The method of claim 1, wherein the sacrificial layer comprises one of a single layer of titanium, a single layer of molybdenum, a multi-layer of titanium and molybdenum, and an alloy of titanium and molybdenum.

11. The method of claim 10, wherein the sacrificial layer is formed with a thickness from about 500Å to about 3,000 Å.

12. The method of claim 1, further comprising removing a remaining portion of the sacrificial layer.

13. The method of claim 12, wherein the remaining portion of the sacrificial layer is removed by a wet etch process using a fluoride-based etchant.

14. The method of claim 1, wherein the data line pattern comprises at least one selected from a group consisting of copper, molybdenum, and aluminum.

15. The method of claim 1, wherein the data line pattern has a single layer structure, a multi-layer structure, or an alloy layer.

16. The method of claim 1, wherein the substrate comprises a pixel area and a pad area formed adjacent to at least one side of the pixel area, and the second process and the third process are performed with respect to at least the pixel area.

17. The method of claim 1, wherein the first process further comprises forming a gate pad with the first conductive material in the pad area of the substrate, the second process further comprises forming a data pad with the second conductive material in the pad area, and the third process further comprises forming a gate pad electrode connected to the gate pad and a data pad electrode connected to the data pad with the third conductive material in the pad area.

18. The method of claim 17, wherein the third process further comprises:
    partially removing the sacrificial layer and the second insulating layer using the photoresist layer pattern as the mask to form a second contact hole through which the data pad is partially exposed; and
    partially removing the sacrificial layer, the second insulating layer, and the first insulating layer to form a third contact hole through which the gate pad is partially exposed.

19. The method of claim 18, wherein the partially exposing of the data pad and the gate pad and the partially exposing of the drain electrode are performed by one process.

20. The method of claim 18, wherein the third process further comprises partially removing the photoresist layer pattern and the pixel electrode layer formed on the photoresist layer pattern to form the data pad electrode connected to the data pad through the second contact hole and the gate pad electrode connected to the gate pad through the third contact hole.

21. The method of claim 2, wherein the forming of the data pad electrode and the gate pad electrode and the forming of the pixel electrode are performed by one process.

* * * * *